(12) United States Patent
Kosyachkov

(10) Patent No.: US 6,793,782 B2
(45) Date of Patent: Sep. 21, 2004

(54) SPUTTER DEPOSITION PROCESS FOR ELECTROLUMINESCENT PHOSPHORS

(75) Inventor: Alexander Kosyachkov, Mississauga (CA)

(73) Assignee: IFIRE Technology Inc., Alberta (CA)

( * ) Notice: Subject to any disclaimer, the term of this patent is extended or adjusted under 35 U.S.C. 154(b) by 0 days.

(21) Appl. No.: 10/036,559

(22) Filed: Dec. 21, 2001

(65) Prior Publication Data

US 2003/0118864 A1 Jun. 26, 2003

(51) Int. Cl.⁷ .............................................. C23C 14/34
(52) U.S. Cl. ........................... 204/192.26; 204/192.12; 204/192.29
(58) Field of Search ....................... 204/192.12, 192.26, 204/192.29

(56) References Cited

U.S. PATENT DOCUMENTS

| | | | |
|---|---|---|---|
| 4,027,192 A | 5/1977 | Hanak | 313/498 |
| 4,279,726 A * | 7/1981 | Baird et al. | 204/192.26 |
| 4,389,295 A | 6/1983 | Davey et al. | 204/192.26 |
| 4,508,610 A | 4/1985 | Freeman et al. | 204/92.26 |
| 4,675,092 A | 6/1987 | Baird et al. | 204/192.26 |
| 5,003,221 A | 3/1991 | Shimizu | 313/509 |
| 5,200,277 A | 4/1993 | Nakayama et al. | 428/690 |
| 5,500,103 A | 3/1996 | Katou et al. | 204/192.26 |
| 5,505,986 A | 4/1996 | Velthaus et al. | 427/66 |
| 5,747,929 A * | 5/1998 | Kato et al. | 313/503 |
| 5,965,192 A | 10/1999 | Potter | 427/64 |
| 6,090,434 A | 7/2000 | Sugiura et al. | 427/64 |
| 6,254,740 B1 | 7/2001 | Kato et al. | 204/192.25 |
| 2001/0043043 A1 | 11/2001 | Aoyama et al. | 313/506 |

FOREIGN PATENT DOCUMENTS

| | | |
|---|---|---|
| EP | 0 667 383 A2 | 8/1995 |
| EP | 0 740 490 A1 | 10/1996 |
| WO | WO 02/23957 A1 | 3/2002 |
| WO | WO 02/051960 A1 | 7/2002 |

OTHER PUBLICATIONS

Benalloul P. et al, "IIA–iII$_2$–S$_4$ ternary compounds: New Host matrices for full color thin film electroluminescence displays", Applied Physics Letters, American Institute of Physics, NY, vol. 63, No. 14, Oct. 4, 1993, pp. 1954–1956, English.

Miura, N. et al., "High–Luminance Blue–Emitting BaAl$_2$S$_4$:EU Thin–Film Electroluminescent Devices", Japanese Journal of Applied Physics, Publication Board, Japanese Journal of Applied Physics, Japan, Part 2, No. 118, Nov. 15, 1999, vol. 38, No. 11B, pp. L1291, L1292, English.

* cited by examiner

Primary Examiner—Rodney G. McDonald
(74) Attorney, Agent, or Firm—Fay, Sharpe, Fagan, Minnich & McKee, LLP

(57) ABSTRACT

The invention is a novel sputter deposition process for thin film phosphors that provide high luminance and colors required for TV applications.

43 Claims, 4 Drawing Sheets

SPUTTER DEPOSITION PROCESS FOR ELECTROLUMINESCENT PHOSPHORS

FIELD OF THE INVENTION

The present invention relates to a novel sputter deposition method for electroluminescent phosphors used in thick dielectric electroluminescent (TDEL) displays. More specifically, the invention relates to a dual source sputter deposition method in which one of the targets comprises a metal and the other comprises the remaining elemental constituents of the phosphor.

BACKGROUND OF THE INVENTION

Thick dielectric electroluminescent displays (TDEL) provide a great advance in flat panel display technology. TDEL displays comprise a basic structure of a substrate upon which an electrically conductive film is deposited. A thick film layer consisting of a ferroelectric material is then deposited on the thick film layer. A phosphor film is deposited on the thick film layer followed by an optically transparent but electrically conductive film to form the second electrode in the structure.

The thick film dielectric structure provides for superior resistance to dielectric breakdown as well as a reduced operating voltage as compared to other types of flat displays. The thick film dielectric structure when deposited on a ceramic substrate withstands higher processing temperatures than for example, TFEL devices, which are typically fabricated on glass substrates. This increased high temperature tolerance facilitates annealing of phosphor films at higher temperatures to improve their luminosity. However, even with this enhancement, it is desired to achieve even higher quality phosphor luminance and color coordinates as demonstrated by cathode ray tube (CRT) displays.

A high luminosity full colour electroluminescent display requires the use of red, green and blue sub-pixels. Optical filters are needed to achieve the required colour coordinates for each sub-pixel. Consequently, the thin film phosphor materials used for each sub-pixel must be patterned so that there is minimal attenuation of the emission spectrum for each colour of pixel by the optical filters. For relatively low-resolution displays, the required patterning can be achieved by depositing the phosphor materials through a shadow mask. For displays with high resolution, however, the shadow mask technique does not provide adequate accuracy, and photolithographic methods must be employed. Photolithographic techniques require the deposition of photoresist films and the etching or lift-off of portions of the phosphor film to provide the required pattern.

Deposition and removal of photoresist films and etching or lift-off of phosphor films typically require the use of solvent solutions that contain water or other protic solvents. Some phosphor materials, for example strontium sulphide are susceptible to hydrolysis, and water and protic solvents may degrade the properties of the phosphor materials.

The deficiencies in phosphor materials are most severe with the phosphors used for blue sub-pixels, and may be compensated for to some extent by increasing the area of the blue sub-pixels relative to the area of the red and green sub-pixels. However, such a design modification demands increased performance from the phosphor materials used for the red and green phosphor materials, and requires the use of higher display operating voltages. The higher operating voltages increase the power consumption of the display, decrease the reliability and increase the cost of driving the electronics of the display.

Vacuum deposition is a method that can be used to produce and deposit phosphor films from a single source pellet using sputtering or electron beam evaporation. However, the yielded films do not exhibit high luminosity. Improved luminance of barium thioaluminate phosphors has been achieved by using a hopping electron beam deposition technique to deposit films from two source pellets. In this method, the stoichiometry of the deposited film is controlled by controlling the relative dwell time of the electron beam impinging on each of the two source materials. While effective, this technique is not well adapted for commercial production of large area displays and is difficult to control to compensate for changes in the evaporation rates from the two sources as the deposition proceeds and the source pellets are depleted.

Sputtering is a well known technique for making a phosphor layer. Sputtering can involve the use of a single, dual or multiple source for the production of a phosphor layer. Sputtering processes are described in for example, U.S. Pat. Nos. 4,389,295, 4,508,610, 4,675,092, 5,003,221 and 6,254,740.

To improve the stoichiometry of certain phosphors such as thioaluminate phosphors, dual sources are used for the deposition requiring added controls over the relative deposition rates for the different sources. The required relative evaporation rates must be calibrated for each specific piece of deposition equipment and the requirement for multiple sources constrains the design of the deposition equipment, generally adding to the cost of the equipment. Further, evaporation methods are not well suited for the deposition of large area films such as a required for the fabrication of large electronic displays such as those for the wall television application.

While the aforementioned generally provides various methods for deposition of phosphor films, it would be advantageous to provide a method for depositing a phosphor film that can be etched and is also stable in the display operation. Furthermore, it would desirable that such a method also be economic and practical for the deposition of phosphor films over large areas.

SUMMARY OF THE INVENTION

The present invention relates to a novel process for depositing large area multi-element thin films for electroluminescent phosphors that provide a high luminosity and a suitable emission color. It also relates to the deposition of a phosphor film that can be etched in a patterning step and then further heat treated to form a stable phosphor film. It also relates to reducing the cost of equipment used to deposit the phosphor materials onto the dielectric layers.

The present invention utilizes two sputtering targets to deposit an alkaline earth thioaluminate phosphor film onto a suitable substrate in a sulfur containing atmosphere. Typically an activator species selected to provide the desired light emission color is also added to one of the targets. One of the sputtering targets is elemental metal. The other sputtering target comprises the remaining ingredients in the phosphor so that the resultant phosphor composition comprises a thioaluminate composition in combination with one or more elements from group IIA and IIB of the Periodic Table of Elements. The activator species is added to one of the targets and is selected from the group consisting of alkaline earth sulfide and a rare earth sulfide or oxide and mixtures thereof.

The use of elemental metal as a target in the sputtering deposition process is an improvement over prior art sputtering processes. The use of elemental metal ensures a high sputter deposition rate and also acts to minimize oxygen contamination of the second target and deposited phosphor composition. As a result, the deposited phosphor composition is etchable, provides desirable luminescence and is stable in display operation. Elemental metals suitable for use in the present invention are those of Group IIIA of the Periodic Table of Elements. More preferably, the metals are selected from the group consisting of aluminum, gallium and indium Most preferred for use in the present invention is aluminum.

The second target is typically a sulfur containing compound. More preferably, the second target is a sulfide compound comprising one or more elements of Group IIA and/or Group IIB of the Periodic Table of Elements.

The activator species is preferably cerium or europium.

In accordance with the present invention, there is provided a dual source sputtering deposition method for deposition of a thin film phosphor composition which uses an elemental metal, preferably aluminum, as one of the two sources.

In accordance with a further aspect of the present invention, the method is conducted in a sulfur containing atmosphere. The sulfur containing atmosphere is preferably one of hydrogen sulfide or sulfur vapour under low pressure to provide sufficient sulfur in the deposited phosphor composition. The sulfur may be provided at pressures ranging from about 1 to $10 \times 10^{-3}$ torr, more preferably, 3 to $7 \times 10^{-3}$ torr, and even more preferably 4 to $6 \times 10^{-3}$ torr.

In accordance with a further aspect of the present invention, sputtering is done at a rapid sputtering rate to minimize oxygen incorporation into the deposited phosphor composition. This is facilitated by the use of aluminum as the preferred elemental metal as one of the two sources.

In accordance with another aspect of the present invention, the sputtering method of the present invention is suitable for the production of a thin film phosphor composition onto a desired and suitable substrate having a large surface area. This adds to the economic feasibility of the method and its large scale commercial use.

In accordance with still a further aspect of the present invention, the sputtering method of the present invention can be conducted modulating the relative deposition rate of materials arising from each of the two sources. This facilitates deposition of a laminated film with a periodic composition alternatively rich and poor in aluminum.

In accordance with yet another aspect of the present invention, the sputtering method of the present invention may be conducted such that sputtering of the two targets is effected onto a rotating and/or oscillating substrate to effect the deposition of a laminated phosphor composition. The rotating and/or oscillating substrate is alternately positioned in the flux of atomic species sputtered from each of the two targets. The thickness of the layers of the laminated composition may be altered by changing the rotation rate or the oscillation rate of the substrate.

In accordance with an aspect of the present invention is a dual source sputtering method for the deposition of a thin film phosphor composition onto a substrate, said method comprising the steps of:

providing a metal as a first source providing a sulfur bearing compound as a second source;

doping said first or second source with a rare earth activator; and applying sufficient current to the first and second sources in a sulfur containing atmosphere to effect sputtering of said target and deposition of said phosphor composition on said substrate.

In accordance with another aspect of the present invention is a dual source sputtering method for the deposition of a thin film phosphor composition onto a substrate, said method comprising the steps of:

placing a metal as a first source and a sulfur bearing compound as a second source within a chamber having an atmosphere of hydrogen sulfide or sulfur vapours;

doping said first or second source with a rare earth activator; and applying sufficient electrical energy to said first and second target to cause sputtering thereof and a flux of atomic species of said first and second targets onto said substrate.

In accordance with a further aspect of the present invention is a thin film laminated phosphor comprising;

alternate layers of metal sulfide and rare earth doped alkaline earth sulfide.

In accordance with a further aspect of the present invention is a thin film laminated phosphor comprising;

alternate layers of aluminum sulfide and rare earth doped alkaline earth sulfide.

The methods of the present invention are particularly suitable for deposition of thioaluminate based blue phosphors.

In accordance with yet a further aspect of the present invention is a thick dielectric electroluminescent display comprising;

a rigid substrate;

a lower electrode layer directly adjacent said substrate, said lower electrode layer comprising an electrically conductive metallic film;

a thick film dielectric layer provided on an upper surface of said electrode layer;

a phosphor film deposited on said thick film dielectric layer, said phosphor film comprising an alkaline earth thioaluminate phosphor film; and an upper electrode layer comprising an optically transparent electrically conductive film.

In accordance with yet a further aspect of the invention is a method for preparing a thin film phosphor composition, said method comprising the steps of;

placing a substrate with a reactive chamber;

supplying a sputtering gas mixture of hydrogen sulfide at a pressure of about $5 \times 10^{-3}$ torr to the reactive chamber;

applying power to a first source of elemental aluminum; and a second source of alkaline earth sulfide in a ratio of about 1:1 to 5:1;

said first or second source additionally comprising an activator species of a rare earth sulfide or rare earth oxide;

wherein applying said power to said first and second sources causes sputtering thereof and a flux of atomic species of said first and second targets onto said substrate to form a thin film alkaline earth thioaluminate phosphor composition.

In accordance with yet a further aspect of the invention is a method for preparing a thin film phosphor composition, said method comprising the steps of;

placing a substrate with a reactive chamber;

supplying a sputtering gas mixture of hydrogen sulfide at a pressure of about $5 \times 10^{-3}$ torr to the reactive chamber;

applying power to a first source of elemental aluminum and to a second source of alkaline earth sulfide in a ratio of about 1:1 to 5:1 said first or second source additionally comprising an activator species of a rare earth sulfide or rare earth oxide;

wherein applying varying levels of power to said first and second sources causes sputtering thereof and a flux of atomic species of said first and second targets onto said substrate to form a thin film laminated alkaline earth thioaluminate phosphor composition.

BRIEF DESCRIPTION OF THE DRAWINGS

The present invention will become more fully understood from the following drawings. The drawings are given for illustration only and do not limit the scope of the invention.

DETAILED DESCRIPTION OF THE INVENTION

Figure 1:
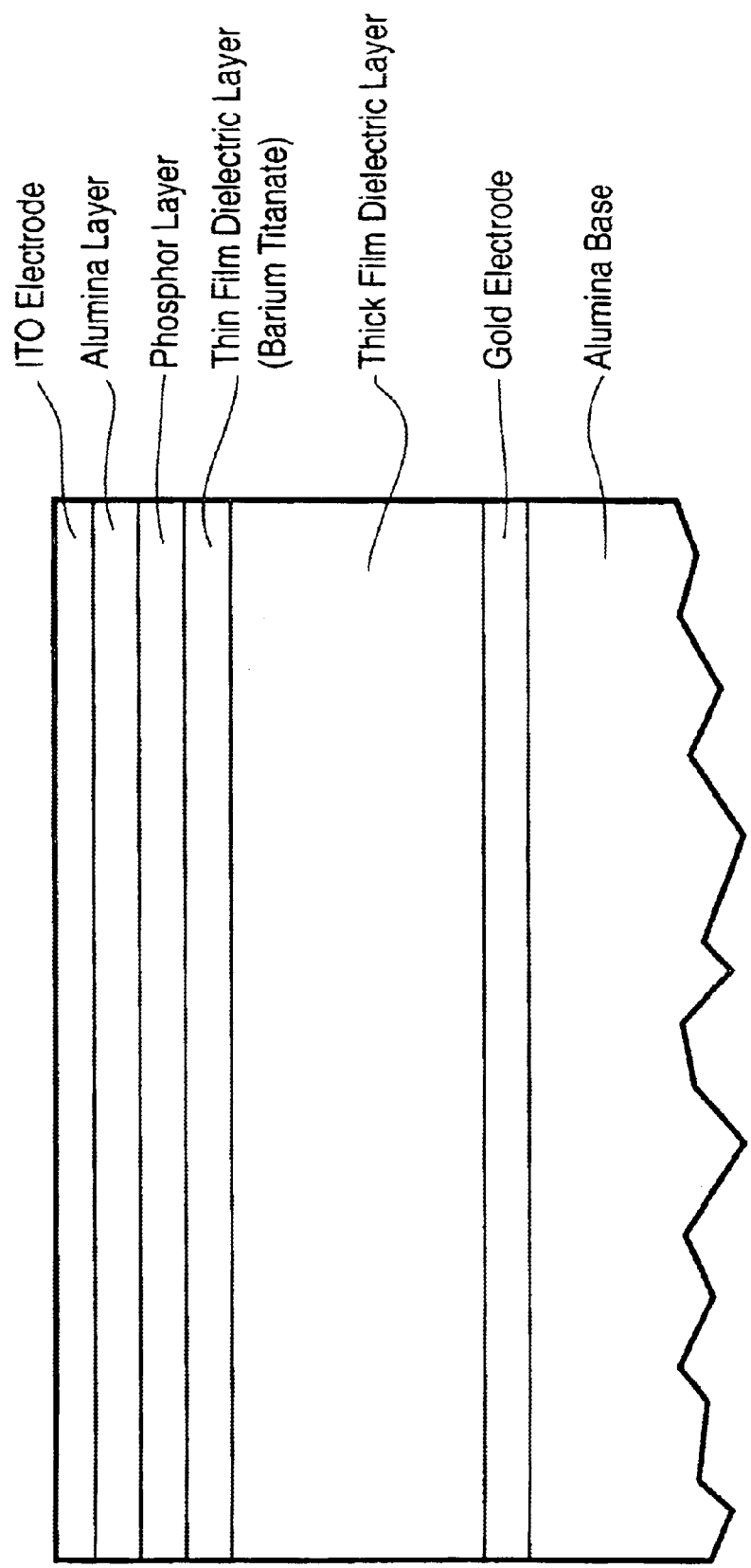
FIG. 1 shows a section of an electroluminescent display comprising a thick film dielectric layer and a phosphor composition.

The present invention is a novel dual source sputtering process for the deposition of a rare earth activated alkaline earth thioaluminate phosphor composition that has use in TDEL displays (FIG. 1). In the method one of the targets is a metal. The second or other target comprises the remaining ingredients in the phosphor. The first or second target can be doped with the rare earth activator species. The relative deposition rates of the material from the two source targets can be controlled by the radio frequency power applied to the respective targets in order to provide a laminated phosphor composition of which the thickness of the layers can be varied. The laminated phosphor composition is suitable for further heat treatment to form a stable homogeneous phosphor layer.

The present invention incorporates the use of a metal as the first source. Suitable metals are those selected from Group IIIA of the Periodic Table of Elements. More preferably are aluminum, gallium and indium. The most preferred metal for use in the present invention is aluminum. The use of aluminum metal rather than aluminum sulfide as a source material for the target reduces oxygen contamination in the deposited film and thus enhances film characteristics and performance. Where lower melting point metals are used such as gallium or indium, additional cooling must be carried out.

The second source is generally a sulfur bearing compound and more specifically is a sulfide compound comprising one or more elements from group IIA and IIB of the Periodic Table of Elements. More preferably, the second source may be selected from one or more alkaline earth sulfides.

The activator species can be provided together with either of the first or second source. The activator species is selected from a rare earth sulfide and rare earth oxide. Most preferably, the activator species is cerium or europium.

The sputtering of the two sources is carried out in a low pressure sulfur containing atmosphere in order to provide adequate sulfur to form the desired film composition with desired thickness. Hydrogen sulfide or sulfur vapour is most commonly used to provide sufficient sulfur content in the deposited film. Typical pressures may range from about 1 to $10 \times 10^{-3}$ torr, more preferably, 3 to $7 \times 10^{-3}$ torr, and even more preferably 4 to $6 \times 10^{-3}$ torr. As there may be some background pressure of oxygen in the sputtering chamber, it is desirable to facilitate a relatively rapid sputtering rate to minimize the incorporation of oxygen in to the deposited films.

It is found that a feasible sputtering rate is strongly affected by the sulfur-containing atmosphere, which causes the formation of an aluminum sulfide film on the aluminum target due to a chemical reaction with the sputtering atmosphere, particularly during active sputtering. If the aluminum target is heavily passivated with sulfur, the sputtering rate is reduced so that phosphor film formation may take two hours or more. If the passivation is abated, deposition can occur in 25 to 30 minutes, thus reducing the available time for oxygen to be incorporated onto the deposit film. Therefore it is necessary to control the concentration of hydrogen sulfide or other sulfur bearing gases within a range that both prevents passivation of the aluminum target by sulfide formation and at the same time ensuring that adequate sulfur is present to react with the sputtered aluminum to form the desired sulfide phosphor films. The use of two sputtering targets facilitates modulation of the relative deposition rate of materials arising from each source. This facilitates deposition of a laminated film with a periodic composition alternately rich and poor in metal, preferably aluminum. The variation can be achieved by using a rotating or oscillating substrate that is alternately positioned in the flux of atomic species sputtered from the respective targets. To the extent that the atomic flux from the two sources are spatially separated from one another, and to the extent that hydrogen sulfide is present in the sputtering chamber, a film can be deposited with a composition that is in one embodiment alternately aluminum sulfide and rare earth doped alkaline earth sulfide. The thickness of the layers can be altered by changing the rotation rate or the oscillation rate of the substrate. The sputtering deposition method of the present invention can be done in any contemporary rf magnetron sputtering system such as those marketed by Edwards, Ulvac, Leybold etc. that is fitted with a gas injection and exhaust system capable of handling hydrogen sulfide and has a deposition substrate heating means.

The present invention in a further aspect, provides the ability to modulate the elemental composition of the deposited phosphor film over the thickness of the film. It has been found that a modulated structure has performance advantages over a homogeneously deposited film. Further, the magnitude of the advantage is dependent on the thickness of the individual layers in the deposited structure. There is a tendency to achieve better performance as the thickness of the layers is increased from about 15 Angstroms to about 50 Angstroms. Increased thickness of the layers is somewhat due to the higher sputtering rate (i.e. Example 3). The results are also to some degree dependent on the atmospheric exposure and temperature associated with subsequent heat treatment steps.

In the fabrication of a TDEL display, the sputtering method of the present invention is used to deposit the phosphor film layer. Typically, aluminum sulfide or barium sulfide encapsulating layers are also used for the phosphor. Such layers have a tendency to enrich the phosphor respectively in barium or aluminum, but otherwise does not appear to have any significant effect on the phosphor luminescence and thus overall device performance.

In summary, the dual source sputtering process of the present invention reliably and cost-effectively produces a phosphor film composition over a wide surface area of substrate that is suitable for use in thick dielectric electroluminescent displays. The thin film phosphors providing a high luminosity and a suitable emission color. Further, the phosphor film can be etched in a patterning step and then further heat treated to form a stable phosphor film.

The direct data contained in the following examples is limited to barium thioaluminate phosphors with a range of elemental ratios, but it is understood that the method can be extended to thioaluminate compositions comprising one or more elements from group IIA and IIB of the Periodic Table of Elements.

The above disclosure generally describes the present invention. A more complete understanding can be obtained by reference to the following specific Examples. These Examples are described solely for purposes of illustration and are not intended to limit the scope of the invention. Changes in form and substitution of equivalents are contemplated as circumstances may suggest or render expedient. Although specific terms have been employed herein, such terms are intended in a descriptive sense and not for purposes of limitation.

EXAMPLES

Example 1

Deposition of Barium Aluminum Sulfide Phosphor Films

Barium aluminum sulfide phosphor films were deposited onto suitable substrates using the method of the present invention.

One sputtering target comprised aluminum and the other sputtering target comprised barium sulfide doped with europium. The power applied to the 3"-diameter aluminum sputtering target was held fixed at about 200 watts and the power to a second 3" diameter sputtering target of barium sulfide doped with europium was held in the range of about 50 to 130 watts. The sputtering atmosphere was hydrogen sulfide maintained at a pressure of about $5 \times 10^{-3}$ torr using a 4 milliliter per minute flow of hydrogen sulfide into the sputter deposition chamber.

The deposition time was about 2 hours. During the deposition the sample substrate was rotated at a rate of about 1.1 revolutions per minute in a manner that the sputtered material from the two sputter targets was alternately deposited on the substrate to form a laminated phosphor structure. The average thickness of the aluminum rich and barium rich layers within the laminated structure was about 15 Angstroms.

The phosphor films were deposited on a thick film substrate comprising an alumina base upon which a gold electrode was deposited followed by a thick film composite dielectric layer and then a thin film barium titanate layer deposited using the techniques described in Applicant's co-pending U.S. patent application Ser. No. 09/761,971. The thickness of the deposited films was about 400 nm. Following deposition, the films were heat treated in a belt furnace under nitrogen with about a 5 minute dwell time at a temperature of about 700° C. to 750° C. In some cases the films were subjected to a further rapid annealing at a maximum temperature of about 900° C. for about 50 seconds. For some applications the phosphor layer was sandwiched between pure barium sulfide layers by sputtering a barium sulfide layer onto the barium titanate covered thick film substrate before the phosphor layer was deposited and sputtering a second barium sulfide layer on top of the phospor layer.

The substrates with deposited phosphors were finished into complete electroluminescent display devices by depositing a thin alumina layer on top of the deposited phosphor, or on top of the barium sulfide layer where present. A second device electrode comprising an indium tin oxide transparent conductive layer was deposited on sandwiched phosphors.

Figure 2:
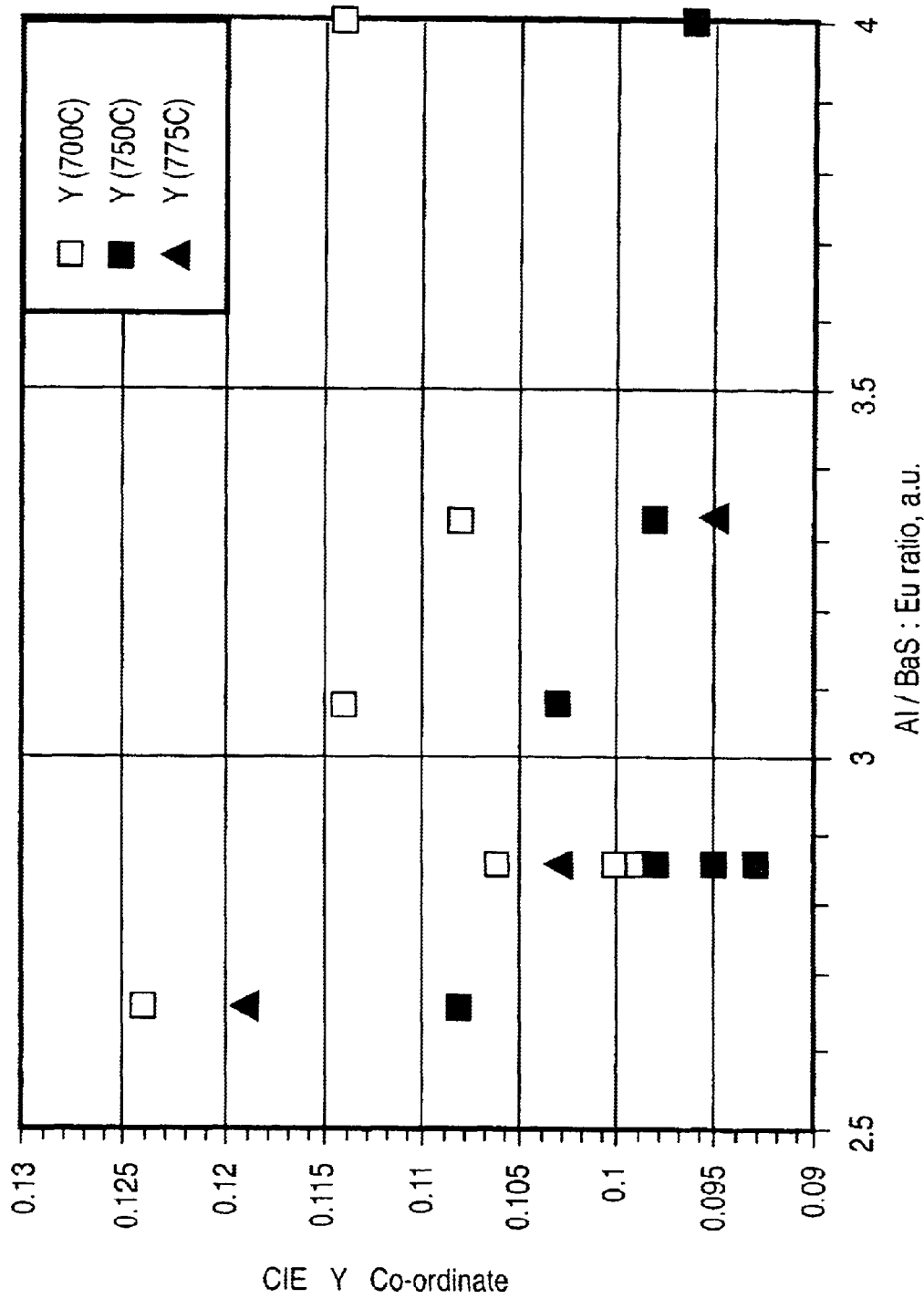
FIG. 2 shows the CIE color y coordinate for electroluminescent display made in accordance with the present invention with different barium to aluminum ratios.
Figure 3:
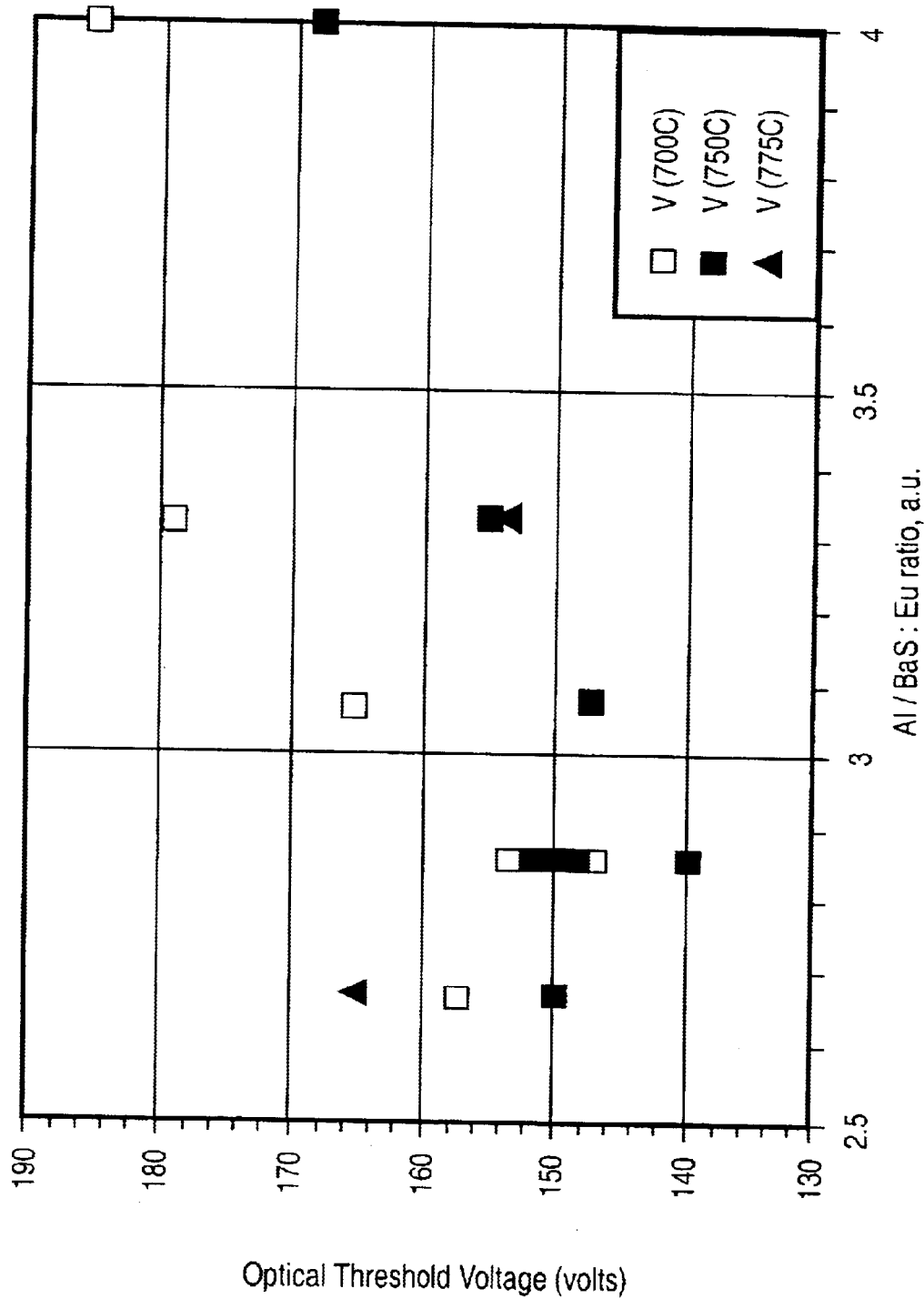
FIG. 3 shows the threshold voltage for electroluminescent displays made in accordance with the present invention with different barium to aluminum ratios.
Figure 4:
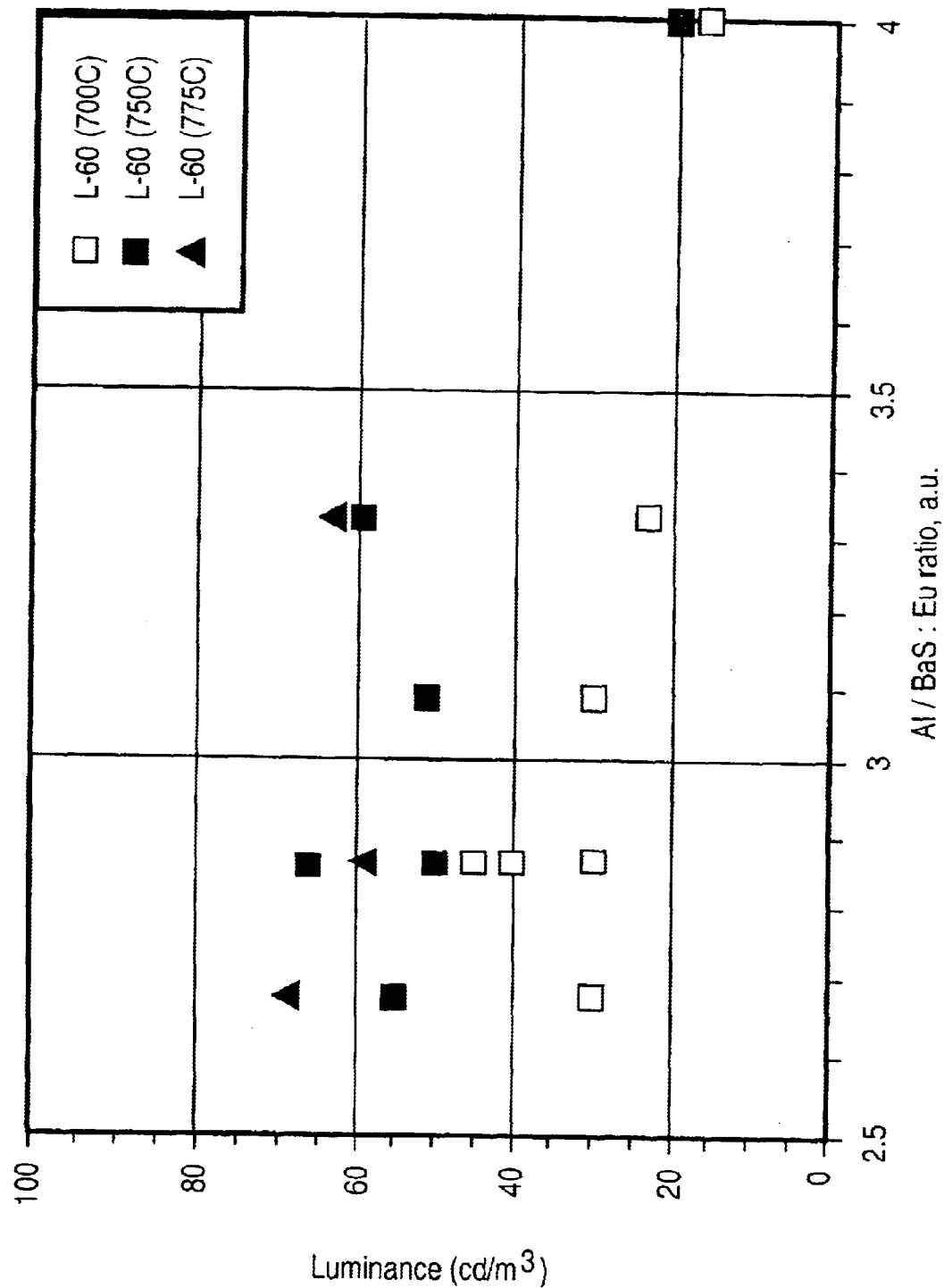
FIG. 4 shows the luminosity at 60 volts above the threshold voltage for electroluminescent displays made in accordance with the present invention with different barium to aluminum ratios.

The display devices were tested using repeated alternating polarity 40 microsecond wide voltage pulses with a voltage amplitude of 60 volts above the threshold voltage where the display devices began emitting light with a luminosity greater than 1 candela per square meter. The pulse repetition rate was 240 pulses per second. The performance results are shown in FIGS. 2, 3 and 4. As seen in FIG. 2, the CIE y colour coordinate reached a minimum of 0.10 when the ratio of power to aluminum target to barium containing target is about 3:3.5. Devices with barium sulfide layers sandwiching the phosphor layer show a change to a higher y coordinate at a higher aluminum to barium containing source power ratio than devices without the sandwiching layers. This indicates that some barium from the sandwiching layers is becoming incorporated into the phosphor film at some point during the device fabrication. The luminance reached a maximum of 60 to 100 candelas per square meter when the power ratio is in the same range, although there is no data away from this ratio for the barium sulfide sandwiched phosphor devices. The threshold voltage shows a relatively weak maximum near 160 volts in the same range of the barium to aluminum target power ratio, except where the phosphor was sandwiched between barium sulfide layers, in which case the threshold voltage was considerably higher, possibly due to an additional voltage drop across the barium sulfide layers.

In general, the results indicate that the performance of the phosphors deposited in accordance with the present invention is comparable to that of phosphors deposited using electron beam evaporation methods and thus is efficient and reliable.

Example 2

Electroluminescent display devices similar to those of example 1 were manufactured, but with a deposition rate of 30 minutes rather than 2 hours. The higher deposition rate was achieved by lowering the hydrogen sulfide injection rate to about 3 milliliters per minute to reduce the degree of sulfide passivation on the aluminum target and by increasing the power at the target to about 220 watts. The substrate rotation rate was the same as in example 1 so that the layer thickness in the phosphor laminate was about 60 Angstroms rather than about 15 Angstroms. The ratio of the power applied to the aluminum target to that of the barium-containing target was in the range 1.3:2.0. The measured CIE y colour coordinate for these devices was similar to those in example 1 for the same sputter target to power ratio. The threshold voltages were similar to those in example 1. However, the luminance for devices without barium sulfide sandwiching layers was about 100% greater than that for corresponding samples in example 1. The increase was less marked for devices with the barium sandwiching layers, but was still on average about 50% higher than for the devices in example 1.

Example 3

Electroluminescent devices similar to those in example 2 were prepared, but using a sample rotation rate of 3 revolutions per minute rather than 1.1 revolutions per minute. In this case the thickness of the layers in the laminate was about 22 Angstroms rather than 60 Angstroms. There was no significant difference in the luminance, threshold voltage or CIE y colour coordinates of these display devices as compared to those of example 2, indicating that the increased performance of the display devices in example 2 over those in example 1 is likely related to the increase in deposition rate than to the increase in the thickness of the layers in the phosphor laminate. This is consistent with the assumption that the improvement is due to a reduction in the oxygen or other impurity content of the deposited phosphor.

Example 4

Electroluminescent display devices were fabricated with a phosphor deposited using a ratio of power to the aluminum source to the barium-containing source material of about 3:1 and with a long deposition time of two hours, similar to those in example 1. The phosphor films were sandwiched within a variety of layers including between two aluminum sulfide layers, two barium sulfide layers, a barium sulfide layer on top with aluminum sulfide layer below, or an aluminum sulfide layer on top and a barium sulfide layer below. Corresponding sandwiched phosphor structures were deposited on silicon wafers for x-ray diffraction analysis (XRD) and semi-quantitative elemental analysis by energy dispersive x-ray spectroscopy (EDS). The XRD data illustrated that the phosphor layers sandwiched between two barium sulfide layers were comprised predominantly of crystalline $BaAl_2S_4$. By contrast, the phosphor layers sandwiched between aluminum sulfide layers were comprised predominantly of $BaAl_4S_7$, indicating a higher aluminum content than the former sample. These results indicate that the phosphor layer is incorporating barium and aluminum respectively from the sandwiching layers. For the phosphor layer sandwiched between one barium sulfide layer and one aluminum sulfide layer the x-ray structure was neither $BaAl_2S_4$ nor $BaAl_4S_7$ and could not be specifically identified. Given the trend with two barium sulfide or two aluminum sulfide sandwiching layers it appears that the unknown phase has an aluminum content relative to the barium content of between that of $BaAl_2S_4$ and $BaAl_4S_7$ This is supported by the EDS data which gives a relative ratio of aluminum to barium of 2.4:1 for barium sulfide encapsulated phosphor, a relative ratio of 5.3:1 for the aluminum sulfide encapsulated phosphor and a relative ratio of about 4.0:1 for the phosphor encapsulated with one barium sulfide layer and one aluminum sulfide layer.

Although preferred embodiments of the invention have been described herein in detail, it will be understood by those skilled in the art that variations may be made thereto without departing from the spirit of the invention.

What is claimed is:

1. A dual source sputtering method for the deposition of a multi-element thin film phosphor composition onto a substrate, said method comprising the steps of:
    providing a metal as a first source
    providing an alkaline earth sulfide as a second source;
    doping said first or second source with a rare earth activator; and
    applying sufficient current to the first and second sources in a sulfur containing atmosphere to effect sputtering of said first and second sources and deposition of said multi-element phosphor composition on said substrate, wherein said multi-element phosphor composition is a ternary or higher composition.

2. The method of claim 1, wherein said first source is a metal of Group IIIA of the Periodic Table of Elements.

3. The method of claim 2, wherein said metal is selected from the group consisting of aluminum, gallium and indium.

4. The method of claim 3, wherein said metal is elemental aluminum.

5. The method of claim 1, wherein said alkaline earth sulfide is barium sulfide.

6. The method of claim 1, wherein said alkaline earth sulfide is barium magnesium sulfide.

7. The method of claim 1, wherein said activator is selected from the group consisting of cerium and europium.

8. The method of claim 1, wherein said phosphor composition is an alkaline earth thioaluminate phosphor film.

9. The method of claim 8, wherein said phosphor composition is a barium thioaluminate phosphor film.

10. The method of claim 8, wherein said phosphor composition is a barium magnesium thioaluminate phosphor film.

11. The method of claim 1, wherein the sulfur containing atmosphere is selected from the group consisting of hydrogen sulfide gas and sulfur vapour.

12. The method of claim 11, wherein sputtering is conducted in a low pressure atmosphere of about 1 to $10 \times 10^{-3}$ torr.

13. The method of claim 11, wherein sputtering is conducted in a low pressure atmosphere of about 3 to $7 \times 10^{-3}$ torr.

14. The method of claim 13, wherein sputtering is conducted in a low pressure atmosphere of about 4 to $6 \times 10^{-3}$ torr.

15. The method of claim 14, wherein sputtering is conducted in a low pressure atmosphere of about $5 \times 10^{-3}$ torr.

16. The method of claim 15, wherein the sputtering rate is maximized to minimize incorporation of oxygen into said deposited phosphor composition.

17. The method of claim 16, wherein said substrate is rotated and/or oscillated to facilitate deposition of a laminated phosphor film that is alternately rich and poor in aluminum.

18. The method of claim 17, wherein the thickness of layers of the laminate are varied by altering the rotation and/or oscillation rate of the substrate.

19. The method of claim 18, wherein said method further comprises the step of homogenizing the laminated phosphor film by thermal processing.

20. The method of claim 1, wherein said deposition of said first and second sources is individually controlled by application of power in a ratio of about 1:1 to 5:1 for the first to second sources.

21. A method for depositing a film onto a substrate, said method comprising the steps of:
    a) providing a substrate having a substrate surface;
    b) depositing a rare earth activated alkaline earth thioaluminate phosphor composition over the substrate surface, the composition being a laminated film with a periodic composition alternatively rich and poor in aluminum.

22. A dual source sputtering method for the deposition of a multi-element thin film phosphor composition onto a substrate, said method comprising the steps of:
    placing a metal as a first source and an alkaline earth sulfide as a second source within a chamber having an atmosphere of hydrogen sulfide or sulfur vapours;

doping said first or second source with a rare earth activator; and applying sufficient energy to said first and second sources to cause sputtering thereof and a flux of atomic species of said first and second sources onto said substrate to provide a phosphor composition, wherein said multi-element phosphor composition is a ternary or higher composition.

23. The method of claim 22, wherein said first source is a metal of Group IIIA of the Periodic Table of Elements.

24. The method of claim 23, wherein said metal is selected from the group consisting of aluminum, gallium and indium.

25. The method of claim 22, wherein said metal is elemental aluminum.

26. The method of claim 22, wherein said alkaline earth sulfide is barium sulfide.

27. The method of claim 22, wherein said alkaline earth sulfide is magnesium sulfide.

28. The method of claim 22, wherein said activator is selected from the group consisting of cerium and europium.

29. The method of claim 22, wherein said thin film phosphor composition is an alkaline earth thioaluminate phosphor film.

30. The method of claim 29, wherein said phosphor composition is a barium thioaluminate phosphor film.

31. The method of claim 29, wherein said phosphor composition is a barium magnesium thioaluminate phosphor film.

32. The method of claim 22, wherein sputtering is conducted in a low pressure atmosphere of about 1 to $10 \times 10^{-3}$ torr.

33. The method of claim 32, wherein sputtering is conducted in a low pressure atmosphere of about 3 to $7 \times 10^{-3}$ torr.

34. The method of claim 33, wherein sputtering is conducted in a low pressure atmosphere of about 4 to $6 \times 10^{-3}$ torr.

35. The method of claim 34, wherein sputtering is conducted in a low pressure atmosphere of about $5 \times 10^{-3}$ torr.

36. The method of claim 22, wherein the sputtering rate is maximized to minimize incorporation of oxygen into said deposited phosphor composition.

37. The method of claim 36, wherein said substrate is rotated and/or oscillated to facilitate deposition of a laminated phosphor film that is alternately rich and poor in aluminum.

38. The method of claim 37, wherein the thickness of layers of the laminate are varied by altering the rotation and/or oscillation rate of the substrate.

39. The method of claim 22, wherein said method further comprises the step of homogenizing the laminated phosphor film by thermal processing.

40. The method of claim 22, wherein said deposition of said first and second sources are individually controlled by application of varying power applied to said first and second source.

41. The method of claim 40, wherein power is applied in a ratio of about 1:1 to 5:1 for the first to second sources.

42. A method for preparing a thin film phosphor composition, said method comprising the steps of;

placing a substrate within a reactive chamber;

supplying a sputtering gas mixture of hydrogen sulfide at a pressure of about $5 \times 10^{-3}$ torr to the reactive chamber;

applying power in a ratio of about 1:1 to 5:1 to a first source of elemental aluminum and a second source of alkaline earth sulfide;

said first or second source additionally comprising an activator species of selected from the group consisting of cerium and europium;

wherein applying said power to said first and second sources causes sputtering thereof and a flux of atomic species of said first and second sources onto said substrate to form a thin film alkaline earth thioaluminate phosphor composition.

43. The method of claim 42, wherein varying levels of power are applied to said first and second sources causing differential sputtering thereof and a flux of atomic species of said first and second sources onto said substrate to form a laminated thin film alkaline earth thioaluminate phosphor composition.

* * * * *